(12) United States Patent
Kim et al.

(10) Patent No.: US 8,530,341 B2
(45) Date of Patent: Sep. 10, 2013

(54) METHOD OF MANUFACTURING ORGANIC LIGHT EMITTING DIODE DISPLAY

(75) Inventors: Kwang-Hae Kim, Yongin (KR);
Moo-Jin Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 89 days.

(21) Appl. No.: 12/948,139

(22) Filed: Nov. 17, 2010

(65) Prior Publication Data
US 2011/0117685 A1 May 19, 2011

(30) Foreign Application Priority Data
Nov. 17, 2009 (KR) .................. 10-2009-0111108

(51) Int. Cl.
*H01L 21/20* (2006.01)
(52) U.S. Cl.
USPC ............................................. 438/486; 438/23
(58) Field of Classification Search
USPC ........................................ 438/23, 482, 486
See application file for complete search history.

(56) References Cited

U.S. PATENT DOCUMENTS

| | | | |
|---|---|---|---|
| 2002/0160556 A1* | 10/2002 | Yamazaki et al. | 438/197 |
| 2006/0094213 A1* | 5/2006 | You | 438/482 |
| 2007/0141859 A1* | 6/2007 | Ishihara et al. | 438/795 |
| 2008/0179597 A1* | 7/2008 | Yamazaki et al. | 257/59 |
| 2009/0045403 A1* | 2/2009 | Yamazaki | 257/59 |

FOREIGN PATENT DOCUMENTS

| | | |
|---|---|---|
| JP | 2004-088188 | 3/2004 |
| KR | 10-1999-0058636 A | 7/1999 |
| KR | 10-2002-0026631 A | 4/2002 |
| KR | 10-2005-0028136 | 3/2005 |
| KR | 1020060001569 | 1/2006 |
| KR | 10-2006-0095531 | 8/2006 |
| KR | 100698691 | 3/2007 |
| KR | 10-2007-0111305 A | 11/2007 |

* cited by examiner

*Primary Examiner* — Shaun Campbell
(74) *Attorney, Agent, or Firm* — H.C. Park & Associates, PLC

(57) ABSTRACT

A method of manufacturing an organic light emitting diode display, the method including forming an amorphous silicon layer on a buffer layer disposed on substrate, heat-treating the amorphous silicon film to form a microcrystalline silicon film; and scanning and irradiating a linear laser beam twice or more onto the microcrystalline silicon film to form a polysilicon film, wherein a subsequent scanning of the linear laser beam partially overlaps previous scanning of the linear laser beam in a width direction.

18 Claims, 11 Drawing Sheets

METHOD OF MANUFACTURING ORGANIC LIGHT EMITTING DIODE DISPLAY

CROSS-REFERENCE TO RELATED APPLICATION

This application claims the benefit of Korean Patent Application No. 10-2009-0111108, filed Nov. 17, 2009, in the Korean Intellectual Property Office, the disclosure of which is incorporated herein by reference.

BACKGROUND

1. Field

Aspects of the present invention relate to a method of manufacturing an organic light emitting diode display. More particularly, aspects of the present invention relate to a method of manufacturing an organic light emitting diode display that can display an image by light emission of an organic material.

2. Description of the Related Art

An organic light emitting diode display is a self emissive display that displays an image using an organic light emitting diode to emit light.

Thin film transistors (TFTs) and capacitors used in the organic light emitting diode display include a polysilicon film depending on the types of TFTs and capacitors. The polysilicon film is formed by polycrystallizing an amorphous silicon film. The amorphous silicon film can be polycrystallized by various known methods.

Among polycrystallization methods, an excimer laser annealing (ELA) method is widely used because this method enables polycrystallization at a relatively low temperature, and allows the formation of a polysilicon film with excellent characteristics including relatively high electron mobility. In the excimer laser annealing (ELA) method, an amorphous silicon film is polycrystallized by scanning and irradiating an excimer laser beam having the shape of a line.

However, as organic light emitting diode displays are becoming larger in size, the polysilicon film is becoming larger in area. It is difficult to form such a polysilicon film having a large area by performing scanning and irradiation only once. Thus, a polysilicon film is usually formed by scanning and irradiating the excimer laser beam onto an amorphous silicon film twice or more.

However, if the excimer laser beam is scanned and irradiated onto the amorphous silicon film twice or more, some regions are irradiated with the excimer laser beam twice due to process tolerance. That is, the polysilicon film is divided into a region irradiated once with the excimer laser beam and a region irradiated twice with the excimer laser beam. There is a difference in crystallinity between the region irradiated once and the region irradiated twice, such that the regions have different characteristics. Therefore, the characteristics of such elements as a thin film transistor of the organic light emitting diode display become non-uniform.

The above information disclosed in this Background section is only for enhancement of understanding of the background of the invention and therefore it may contain information that does not form the prior art that is already known in this country to a person of ordinary skill in the art.

SUMMARY

Aspects of the present invention provide a method of manufacturing an organic light emitting diode display which makes it possible to uniformly form crystalline grains of a polysilicon film while using an excimer laser annealing (ELA) method.

According to aspects of the present invention, an amorphous silicon film is formed to manufacture an organic light emitting diode display. Then, a microcrystalline silicon film is formed by heat-treating the amorphous silicon film. Subsequently, a polysilicon film is formed by irradiating a linear laser beam twice or more onto the microcrystalline silicon film so as to be partially overlapped in a width direction.

According to another aspect of the present invention, the heat treatment may be carried out at a temperature ranging from about 580° C. to about 750° C.

According to another aspect of the present invention, the heat treatment may be carried out for about 10 to 180 minutes.

According to another aspect of the present invention, the microcrystalline silicon film may be formed by a solid phase crystallization method.

According to another aspect of the present invention, the laser beam may be an excimer laser beam, and the polysilicon film may be formed by excimer laser annealing.

According to another aspect of the present invention, the laser beam may have energy density in the range of about 30% to about 70% of the energy density required for the polysilicon film to have the best electron mobility.

According to another aspect of the present invention, the difference in root-mean-square surface roughness between a region formed by being irradiated with the laser beam once and a region formed by being irradiated with the laser beam twice in the polysilicon film may be no more than about 10%.

According to another aspect of the present invention, the laser beam may have energy density in the range of about 150 mJ/cm$^2$ to about 240 mJ/cm$^2$.

According to another aspect of the present invention, the polysilicon film may have electron mobility in the range of about 2 cm$^2$/Vs to about 60 cm$^2$/Vs.

Aspects of the present invention provide a method of manufacturing an organic light emitting diode including: forming an amorphous silicon film; and forming a polysilicon film by scanning and irradiating a linear laser beam twice or more onto the amorphous silicon film so as to be partially overlapped in a width direction. The laser beam may have energy density in the range of about 30% to about 70% of the energy density required for the polysilicon film to have the best electron mobility.

According to another aspect of the present invention, the laser beam may be an excimer laser beam, and the polysilicon film may be formed by excimer laser annealing.

According to another aspect of the present invention, the difference in root-mean-square surface roughness between a region formed by being irradiated with the laser beam once and a region formed by being irradiated with the laser beam twice in the polysilicon film may be no more than about 10%.

According to another aspect of the present invention, the laser beam may have energy density in the range of about 150 mJ/cm$^2$ to about 250 mJ/cm$^2$.

According to another aspect of the present invention, the polysilicon film may have electron mobility in the range of about 2 cm$^2$/Vs to about 10 cm$^2$/Vs.

According to another aspect of the present invention, the method of manufacturing an organic light emitting diode display may further include: forming a semiconductor layer by patterning the polysilicon film; forming a gate insulating layer on the semiconductor layer; forming a gate electrode on the gate insulating layer so as to be overlapped with a part of the semiconductor layer; doping the semiconductor layer with an impurity and dividing the semiconductor layer into a channel region overlapped with the gate electrode and source/drain regions formed on both sides of the channel region; forming an interlayer insulating layer on the gate electrode; and forming a thin film transistor by forming a source electrode connected to the source region and a drain electrode connected to the drain region.

According to another aspect of the present invention, the gate electrode may be made of at least one of molybdenum (Mo), chromium (Cr), and tungsten (W).

According to another aspect of the present invention, the gate insulating layer may include at least one of tetra ethyl ortho silicate (TEOS), silicon nitride ($SiN_x$), and silicon oxide ($SiO_2$).

According to another aspect of the present invention, the impurity may be doped in the source and drain regions of the semiconductor layer with a dose of more than about 1.0e15 atoms/cm².

According to another aspect of the present invention, the method of manufacturing an organic light emitting diode display may further include: forming a first capacitor electrode by patterning the polysilicon film; forming a gate insulating layer on the first capacitor electrode; forming a second capacitor electrode on the gate insulating layer so as to be overlapped with the first capacitor electrode; and forming a capacitor by doping the first capacitor electrode with an impurity.

According to another aspect of the present invention, the laser beam may have energy density in the range of about 200 mJ/cm² to about 250 mJ/cm².

According to another aspect of the present invention, the second capacitor electrode may be made of at least one of molybdenum (Mo), chromium (Cr), and tungsten (W).

According to another aspect of the present invention, the second capacitor electrode may have a thickness ranging from about 30 nm to about 80 nm.

According to another aspect of the present invention, the gate insulating layer may include at least one of tetra ethyl ortho silicate (TEOS), silicon nitride ($SiN_x$), and silicon oxide ($SiO_2$).

According to another aspect of the present invention, the impurity may be doped in the first capacitor electrode with a dose of more than about 1.0e15 atoms/cm².

According to aspects of the present invention, a method of manufacturing an organic light emitting diode display makes it possible to uniformly form crystalline grains of a polysilicon film while using an excimer laser annealing (ELA) method.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
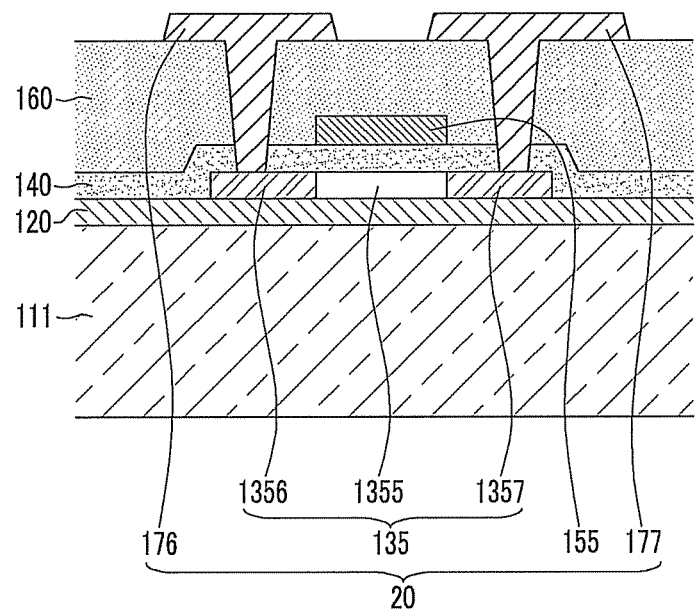
FIG. 1 is a cross-sectional view showing the structure of a thin film transistor manufactured by a method of manufacturing an organic light emitting diode display according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the drawings, the sizes and thicknesses of the components are merely shown for convenience of explanation, and therefore the present invention is not necessarily limited to the illustrations described and shown herein.

In the drawings, the thickness of some layers, films, panels, regions, elements, and areas are exaggerated for clarity and convenience of explanation. Additionally, as referred to herein, it is to be understood that where is stated herein that one film, element or layer is "formed on" or "disposed on" a second layer, element or film, the first layer, element or film may be formed or disposed directly on the second layer, element or film or there may be intervening layers, elements or films between the first layer, element or film and the second layer, element or film. Further, as used herein, the term "formed on" is used with the same meaning as "located on" or "disposed on" and is not meant to be limiting regarding any particular fabrication process.

A method of manufacturing an organic light emitting diode display according to an embodiment of the present invention will be described with reference to FIGS. 1 to 3. FIG. 1 shows a thin film transistor 20 of an organic light emitting diode display manufactured according to the present embodiment of the present invention. As shown in FIG. 1, the organic light emitting diode display includes a substrate main body 111, a buffer layer 120 formed on the substrate main body 111, and a thin film transistor 20 formed on the buffer layer 120.

The substrate main body 111 is formed as an insulating substrate made of glass, quartz, ceramic, plastic, or the like, or as a flexible substrate made of plastic. However, aspects of the present invention are not limited there to and the substrate main body 111 may be formed of other suitable materials. Moreover, the substrate main body 111 may be formed as a metallic substrate made of stainless steel or the like.

The buffer layer 120 has a single-layer structure of silicon nitride ($SiN_x$), or a dual-layer structure of silicon nitride ($SiN_x$) and silicon oxide ($SiO_2$). The buffer layer 120 prevents penetration of unnecessary elements, such as impurity atoms or moisture, and planarizes the surface. However, the buffer layer 120 is not necessarily required, and may be omitted according to the type and process conditions of the substrate main body 111.

The thin film transistor 20 includes a semiconductor layer 135 formed on the buffer layer 120, a gate electrode 155 formed on the semiconductor layer 135, and a source electrode 176 and a drain electrode 177 each connected to the semiconductor layer 135. Here, a gate insulating layer 140 is disposed between the semiconductor layer 135 and the gate electrode 155, and an interlayer insulating layer 160 is disposed between the gate electrode 155 and the source/drain electrodes 176 and 177.

Figure 2:
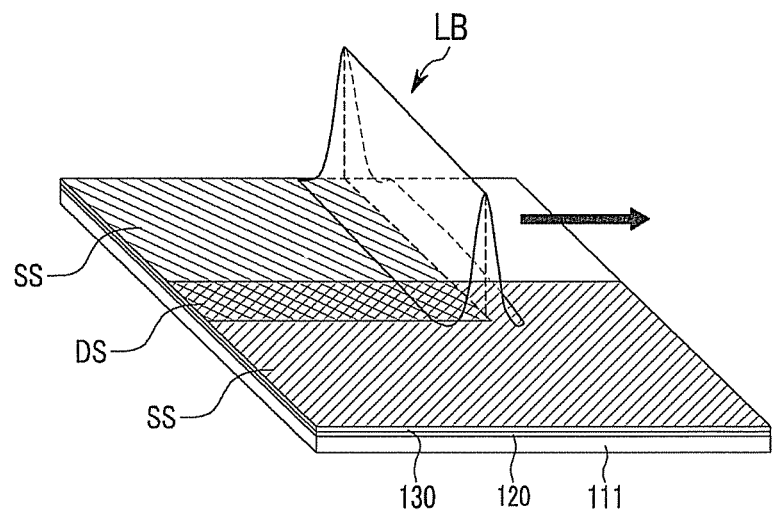
FIG. 2 is a perspective view showing a process of forming a polysilicon film by scanning and irradiating an excimer laser beam according to the embodiment of FIG. 1.
Figure 3:
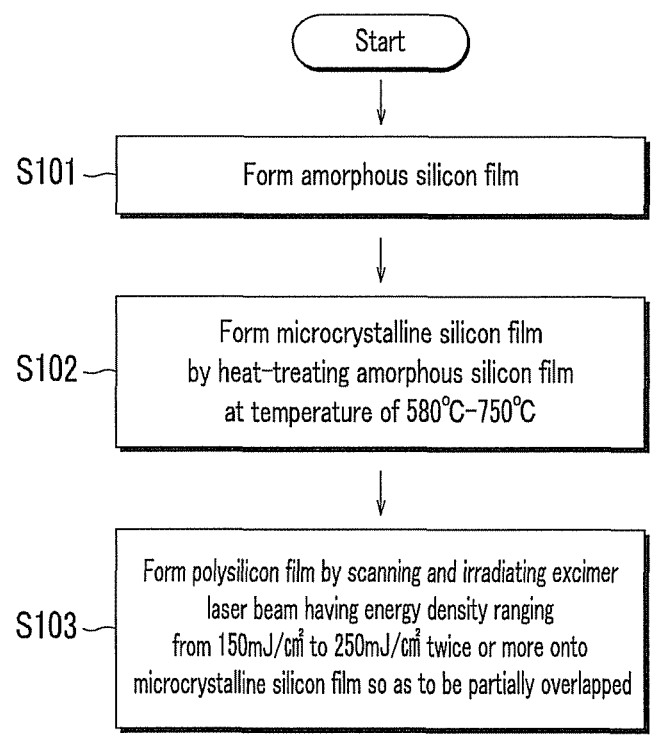
FIG. 3 is a flowchart showing a method of manufacturing an organic light emitting diode display according to the embodiment of FIG. 1.

The semiconductor layer 135 is made of a polysilicon film 130 (shown in FIG. 2). The semiconductor layer 135 is divided into a channel region 1355 overlapped with the gate electrode 155, source region 1356 and drain region 1357 formed on respective sides of the channel region 1355. The channel region 1355 is a polysilicon film doped with no impurity, or, in other words, the channel region 1355 is an intrinsic semiconductor. The source region 1356 and drain region 1357 are polysilicon films doped with an impurity, or, in other words, the source region 1356 and the drain region 1357 are impurity semiconductors.

The source electrode 176 is connected to the source region 1356 of the semiconductor layer 135, and the drain electrode 177 is connected to the drain region 1357 of the semiconductor layer 135.

The gate insulating layer 140 includes at least one of tetra ethyl ortho silicate (TEOS), silicon nitride ($SiN_x$), and silicon oxide ($SiO_2$). For example, the gate insulating layer 140 is formed as a dual layer including a silicon nitride layer having a thickness of about 40 mm and a tetra ethyl ortho silicate layer having a thickness of about 80 nm that are sequentially stacked therein. However, aspects of the present invention are not limited thereto, and the gate insulating layer 140 may be formed in other suitable configurations.

The interlayer insulating layer 160 is formed of an inorganic film, such as that of the gate insulating layer 140. However, aspects of the present invention are not limited thereto, and the interlayer insulating layer 160 may be formed of various suitable inorganic or organic materials. The interlayer insulating layer 160 and the gate insulating layer 140 commonly have contact holes that partially expose the source region 1356 and drain region 1357 of the semiconductor layer 135.

A method of forming the polysilicon film 130 used for the semiconductor layer 135 of the thin film transistor 20 will be described with reference to FIGS. 2 and 3.

A buffer layer 120 is formed on a substrate main body 111, and an amorphous silicon film (not shown) is formed on the buffer layer 120 (S101).

Next, the amorphous silicon film is heat-treated (S102). The amorphous silicon film is heat-treated at a temperature ranging from about 580° C. to about 750° C. The heat-treated amorphous silicon film becomes a microcrystalline silicon film. If the heat treatment temperature is less than about 580° C., microcrystalline grains are improperly formed, and if the heat treatment temperature is greater than about 750° C., the substrate main body 111, which is made of glass or plastic, may be damaged.

Moreover, an appropriate heat treatment time is about 60 minutes or less. Specifically, when the heat treatment is carried out for about 10 to 180 minutes in the range of about 580° C. to about 750° C., microcrystalline grains can be properly formed. Furthermore, the heat treatment can be performed in a manner similar to solid phase crystallization (SPC). However, the treatment temperature and treatment time are consistent with the aforementioned conditions.

Next, a polysilicon film 130 is formed by scanning and irradiating a laser beam LB onto the microcrystalline silicon film (S103). According to an aspect of the present invention, the laser beam LB is an excimer laser beam. In other words, the polysilicon film 130 is formed by excimer laser annealing (ELA). However, aspects of the present invention are not limited thereto, and other suitable laser beams may be used.

Moreover, in order to polycrystallize a relatively large area, the laser beam LB is scanned and irradiated twice or more onto the microcrystalline silicon film. At this point, the laser beam LB is scanned and irradiated so as to be partially overlapped in a width direction due to process tolerance. Therefore, the polysilicon film 130 is divided into a single irradiation region SS that is irradiated once with the laser beam LB and a double irradiation region DS that is irradiated twice with the laser beam LB.

The crystallinity of the polysilicon film 130 varies according to the energy density of the laser beam LB irradiated onto the microcrystalline silicon film. That is, the higher the energy density of the laser beam LB when irradiated, the better the electron mobility and other electric characteristics of the polysilicon film 130. In general, the polysilicon film 130 has the best characteristics when a laser beam LB having energy density of about 350 $mJ/cm^2$ is irradiated. If the energy density of the laser beam LB is much higher than about 350 $mJ/cm^2$, much heat is generated that could damage the substrate main body 111. In general, the higher the energy density of the laser beam LB, the more severe the deviation in characteristics between the single irradiation region SS and the double irradiation region DS.

In the present embodiment of the present invention, the laser beam LB irradiated onto the microcrystalline silicon film has an energy density in the range of about 30% to about 70% of an energy density used such that the polysilicon film 130 has the best characteristics, such as electron mobility. Specifically, the laser beam LB has energy density in the range of about 150 $mJ/cm^2$ to about 240 $mJ/cm^2$. If the laser beam LB has energy density of less than about 150 $mJ/cm^2$, polycrystallization is not properly achieved. If the laser beam LB has an energy density exceeding about 240 $mJ/cm^2$, deviation in characteristics between the single irradiation region SS and the double irradiation region DS are generated and degrade uniformity. That is, when the laser beam LB has an energy density in the range of about 150 $mJ/cm^2$ to about 240 $mJ/cm^2$, polycrystallization is properly achieved, and at the same time, there is almost no deviation in characteristics between the single irradiation region SS and the double irradiation region DS. Therefore, the polysilicon film 130 having uniform crystalline grains over the entire surface can be formed.

The polysilicon film 130 formed according to the present embodiment of the present invention has an electron mobility in the range of about 2 $cm^2/Vs$ to about 60 $cm^2/Vs$. If the electron mobility of the polysilicon film 130 is less than about 2 $cm^2/Vs$, the characteristics of the thin film transistor 20 are degraded, and thus are not suitable for an organic light emitting diode display. On the other hand, if the electron mobility of the polysilicon film 130 exceeds about 60 $cm^2/Vs$, characteristics of the single irradiation region SS and the double irradiation region DS deviate.

Moreover, the polysilicon film 130 is formed such that the difference in root-mean-square (RMS) surface roughness between the single irradiation region SS and the double irradiation region DS is no more than about 10%. The RMS surface roughness is an indicator of a uniformity of the crystalline grains of the polysilicon film 130. According to the manufacturing method of the present embodiment, the crystalline grains of the polysilicon film 130 are uniformly formed while using the excimer laser annealing (ELA). Particularly, both the uniformity and electric characteristics of the polysilicon film 130 are enhanced by forming a microcrystalline silicon film through heat treatment and then polycrystallizing the microcrystalline silicon film.

A method of manufacturing the thin film transistor 20 using the polysilicon film 130 according to the present embodiment of the present invention will be described below with reference to FIG. 1.

First, as stated above, a semiconductor layer 135 is formed by patterning the polysilicon film 130 formed by the excimer laser annealing. Then, a gate insulating layer 140 is formed on the semiconductor layer 135. The gate insulating layer 140 includes a silicon nitride layer having a thickness of about 40 nm and a tetra ethyl ortho silicate (TEOS) layer having a thickness of about 80 nm that are sequentially stacked therein. These inorganic films are formed by a known method such as PECVD. However, aspects of the present invention are not limited thereto and the organic films may be formed by other suitable methods.

Next, a gate electrode 155 is formed on the gate insulating layer 140. The gate electrode 155 is formed so as to be overlapped with a part of the semiconductor layer 135. The gate electrode 155 includes molybdenum (Mo), chromium (Cr), or tungsten (W), which are used singularly or in combination. However, aspects of the present invention are not limited thereto and other suitable materials may be used for the gate electrode 155.

Next, the semiconductor layer 135 is doped with an impurity to form a source region and a drain region. The gate electrode 155 prevents the channel region 1355 from being doped with an impurity when doping the source region 1356 and drain region 1357 of the semiconductor layer 135 with an impurity. Herein, the semiconductor layer 135 is divided into the channel region 1355 overlapped with the gate electrode 155 and the source region 1356 and the drain region 1357 formed on respective sides of the channel region 1355.

The impurity is doped in the source region 1356 and drain region 1357 of the semiconductor layer 135 at an energy higher than about 80 keV and with a dose of more than about 1.0e15 atoms/cm$^2$. The impurity is any one of a P-type impurity and an N-type impurity. The type of the impurity is determined according to the type of the thin film transistor 20.

Next, an interlayer insulating layer 160 is formed on the gate electrode 155. The interlayer insulating layer 160 and the gate insulating layer 140 commonly have contact holes that partially expose the source region 1356 and drain region 1357 of the semiconductor layer 135. Next, a source electrode 176 and a drain electrode 177 are formed on the interlayer insulating layer 160. The source electrode 176 and the drain electrode 177 are respectively connected to the source region 1356 and drain region 1357 of the semiconductor layer 135 via the contact holes of the interlayer insulating layer 160 and the gate insulating layer 140.

According to the above described manufacturing method, the thin film transistor 20 with improved uniformity can be manufactured. Furthermore, although not shown, the organic light emitting diode display is formed by forming an organic light emitting diode connected to the drain electrode 177 of the thin film transistor 20.

Experimental examples and comparative experimental examples according to the present embodiment of the present invention will be described with reference to FIGS. 4 and 5. In Experimental Examples EE1 and EE2, a polysilicon film was formed by a laser beam having energy densities of about 230 mJ/cm$^2$ and about 210 mJ/cm$^2$, respectively. In Comparative Experimental Examples CEE1 to CEE3, a polysilicon film was formed by a laser beam having energy densities of about 250 mJ/cm$^2$, about 270 mJ/cm$^2$, and 290 mJ/cm$^2$, respectively.

Figure 4:
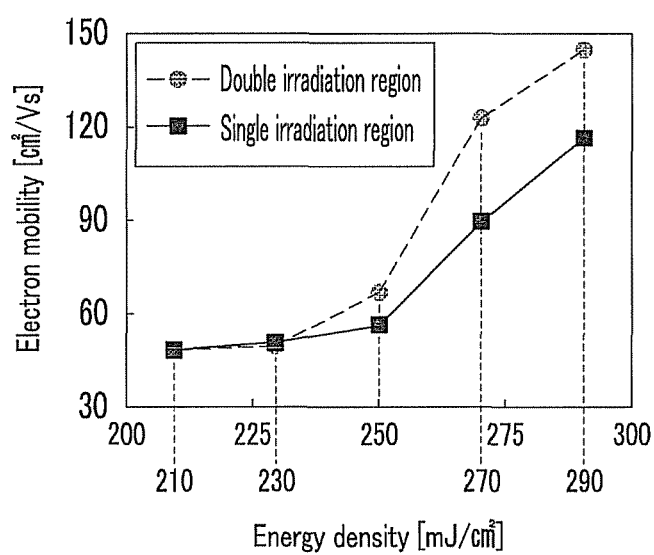
FIGS. 4 to 6 are graphs comparing experimental examples according to embodiment of FIG. 1 with comparative experimental examples.

FIG. 4 is a graph showing variations in electron mobility according to changes in the energy density of a laser beam irradiated to form a polysilicon film. As shown in FIG. 4, in Experimental Examples EE1 and EE2 that fall within the range of about 150 mJ/cm$^2$ to about 240 mJ/cm$^2$, it can be seen that there is almost no deviation in electron mobility between the single irradiation region and the double irradiation region. That is, crystalline grains of the polysilicon film can be uniformly formed across the single irradiation region and the double irradiation region. On the other hand, in Comparative Experimental Examples CEE1 to CEE3, it can be seen that there is a relatively large deviation in electron mobility between the single irradiation region and the double irradiation region.

Figure 5:
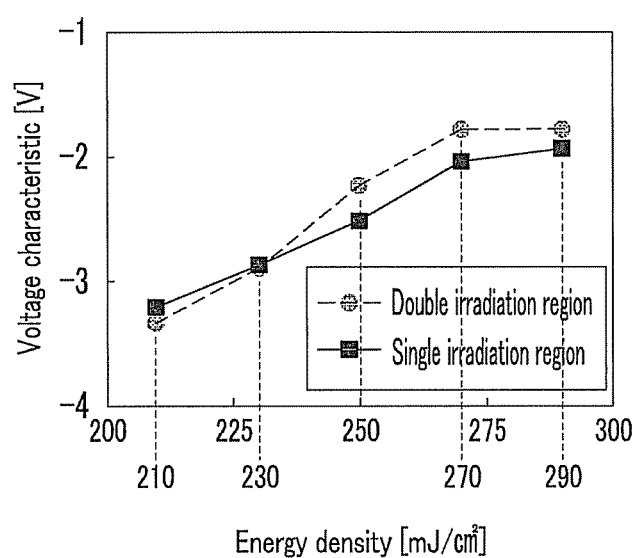
Figure 6:
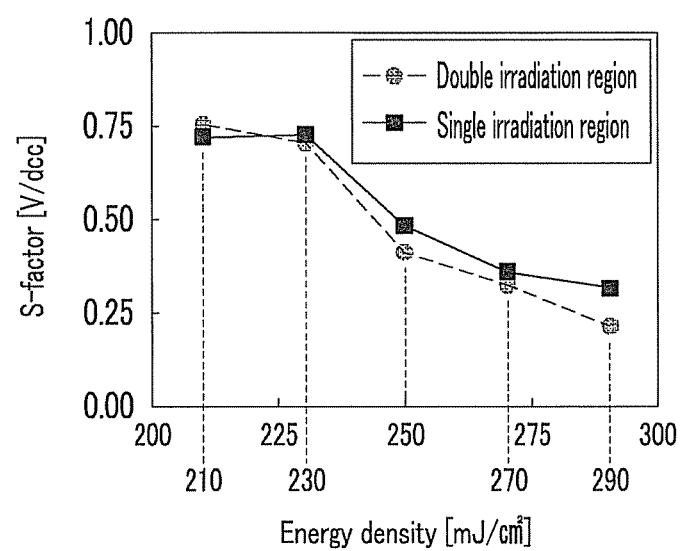

FIGS. 5 and 6 are graphs showing variations in the voltage characteristic and S-factor characteristic of the thin film transistor in response to changes in the energy density of the laser beam irradiated to form a polysilicon film. As shown in FIGS. 5 and 6, in Experimental Examples EE1 and EE2 that fall within the range of about 150 mJ/cm$^2$ to about 240 mJ/cm$^2$. As illustrated in FIGS. 5 and 6, there is almost no deviation in the voltage and S-factor characteristics between the single irradiation region and the double irradiation region. However, in Comparative Experimental Examples CPE1 to CPE3, it can be seen that there is a relatively large deviation in the voltage and S-factor characteristics between the single irradiation region and the double irradiation region.

A method of manufacturing an organic light emitting diode display according to another embodiment of the present invention will be described with reference to FIG. 1, FIG. 2, and FIG. 7. The present embodiment of the present invention is substantially the same as the first exemplary embodiment described in FIGS. 1 to 3, except for the method of forming the polysilicon film 130 that forms the semiconductor layer 135 of the thin film transistors 20.

Figure 7:
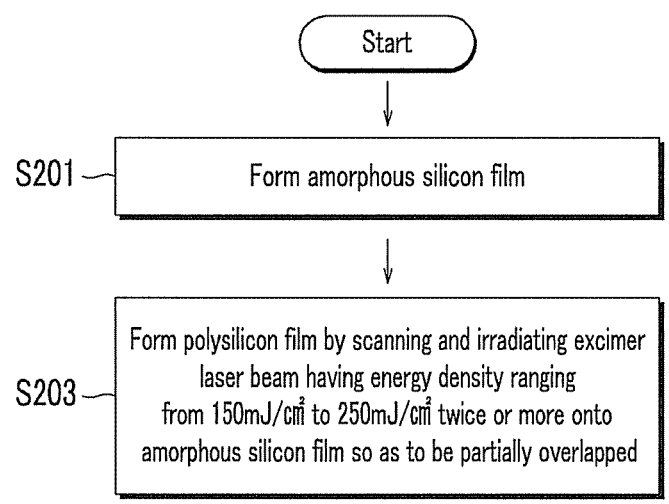
FIG. 7 is a flowchart showing a method of manufacturing an organic light emitting diode display according to another embodiment of the present invention.

As shown in FIG. 7, a buffer layer 120 is formed on a substrate main body 111, and an amorphous silicon film is formed on the buffer layer 120 (S201). Next, a polysilicon film 130 is formed by scanning and irradiating a laser beam LB, which is an excimer laser beam, onto the amorphous silicon film (S203). In other words, the polysilicon film 130 is formed by excimer laser annealing (ELA).

In order to polycrystallize a relatively large area, a laser beam LB is scanned and irradiated twice or more onto the amorphous silicon film. The laser beam LB is scanned and irradiated so as to be partially overlapped in a width direction due to process tolerance. Therefore, as shown in FIG. 2, the polysilicon film 130 is divided into a single irradiation region SS that is irradiated once with the laser beam LB and a double irradiation region DS that is irradiated twice with the laser beam LB.

Meanwhile, the crystallinity of the polysilicon film 130 varies according to an energy density of the laser beam LB irradiated onto the amorphous silicon film. The higher the energy density of the irradiated laser beam LB, the better the electron mobility and other electric characteristics of the polysilicon film 130. In general, the polysilicon film 130 has the best characteristics when a laser beam LB having energy density of about 350 mJ/cm$^2$ is irradiated. If the energy density of the laser beam LB is much higher than about 350 mJ/cm$^2$, much heat is generated that could damage the substrate main body 111. Furthermore, the higher the energy density of the irradiated laser beam LB, the more severe the deviation in characteristics between the single irradiation region SS and the double irradiation region DS.

In the present embodiment of the present invention, the laser beam LB irradiated onto the amorphous silicon film has an energy density in the range of about 30% to about 70% of an energy density required for the polysilicon film 130 to have the best characteristics, i.e., the best electron mobility. Specifically, the laser beam LB has an energy density in the range of about 150 mJ/cm$^2$ to about 250 mJ/cm$^2$. If the laser beam LB has an energy density of less than about 150 mJ/cm$^2$, then proper polycrystallization is not achieved. However, if the laser beam LB has energy density exceeding about 250 mJ/cm$^2$, characteristics between the single irradiation region SS and the double irradiation region DS deviate to such an extent so as to degrade uniformity in the polysilicon film. In other words, when the laser beam LB has an energy density in the range of about 150 mJ/cm$^2$ to about 250 mJ/cm$^2$, polycrystallization is properly achieved, and at the same time, there is almost no deviation in characteristics between the single irradiation region SS and the double irradiation region DS. Therefore, the polysilicon film 130 having uniform crystalline grains over the entire surface can be formed.

The polysilicon film 130 formed according to the previously discussed embodiment of the present invention has an electron mobility in the range of about 2 cm$^2$/Vs to about 60 cm$^2$/Vs. If the electron mobility of the polysilicon film 130 is less than about 2 cm$^2$/Vs, the characteristics of the thin film transistor 20 are degraded, and thus not suitable for an organic light emitting diode display. On the other hand, if the electron mobility of the polysilicon film 130 exceeds about 60 cm$^2$/Vs, characteristics between the single irradiation region SS and the double irradiation region DS are not similar.

The polysilicon film 130, according to the present embodiment of the present invention, has an electron mobility that is lower than the electron mobility of the previously discussed embodiment by about 30 cm$^2$/Vs. This is because the final crystallinity of the polysilicon film 130 is relatively low since the heat treatment process is not performed in the present embodiment in contrast to the previously discussed embodiment. However, the present embodiment omits the heat treatment process, so that the entire manufacturing process can be simplified. Therefore, the manufacturing method, according to the present embodiment of the present invention is effective when high electron mobility is not needed.

Moreover, the polysilicon film 130 is formed such that the difference in root-mean-square (RMS) surface roughness between the single irradiation region SS and the double irradiation region is no more than about 10%. The RMS surface roughness is an indicator of a uniformity of the crystalline grains of the polysilicon film 130.

A method of manufacturing an organic light emitting diode display by forming a thin film transistor 20 using the polysilicon film 130 formed according to the present embodiment of the present invention is identical to that of the previously discussed embodiment. According to the manufacturing method of the present embodiment, the crystalline grains of the polysilicon film 130 are uniformly formed using the excimer laser annealing (ELA). Moreover, the entire manufacturing process is simplified because the polysilicon film 130 is formed by using only the excimer laser annealing (ELA).

Now, experimental examples and comparative experimental examples according to the present embodiment of the present invention will be described with reference to FIGS. 8 and 9. In Experimental Examples EE1 and EE2, a polysilicon film was formed by a laser beam having energy densities of about 200 mJ/cm$^2$ and about 250 mJ/cm$^2$, respectively. In Comparative Experimental Examples CEE1 and CEE2, a polysilicon film was formed by a laser beam having energy densities of about 300 mJ/cm$^2$ and about 350 mJ/cm$^2$, respectively.

Figure 8:
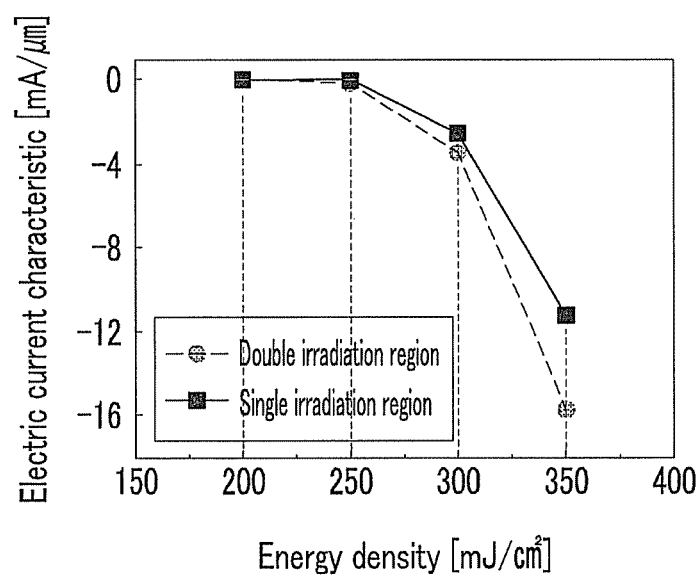
FIGS. 8 and 9 are graphs comparing experimental examples according to the embodiment of FIG. 7 with comparative experimental examples.

FIG. 8 is a graph showing variations in electric current characteristics according to changes in the energy density of a laser beam irradiated to form a polysilicon film. As shown in FIG. 8, in Experimental Examples EE1 and EE2 that fall within the range of about 150 mJ/cm$^2$ to about 250 mJ/cm$^2$, respectively, it can be seen that there is almost no deviation in electric current characteristics between the single irradiation region and the double irradiation region. That is, crystalline grains of the polysilicon film are uniformly formed across the single irradiation region and the double irradiation region. On the other hand, in Comparative Experimental Examples CEE1 and CEE2, it can be seen that there is a relatively large deviation in electric current characteristics between the single irradiation region and the double irradiation region.

Figure 9:
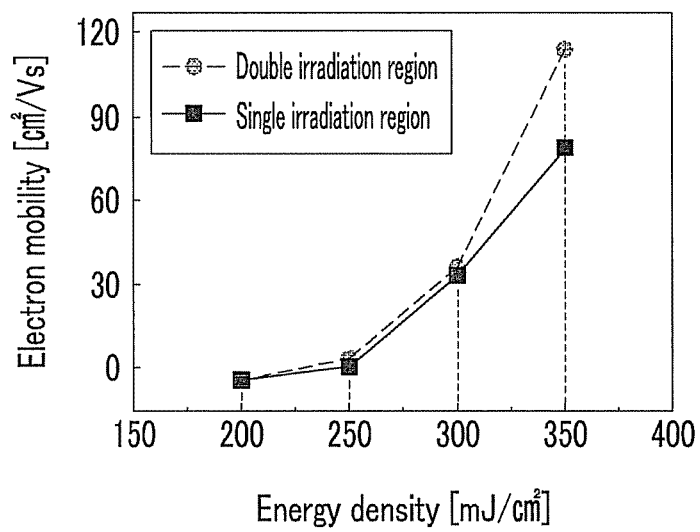

FIG. 9 is a graph showing variations in the electron mobility of the thin film transistor according to changes in the energy density of the laser beam irradiated to form a polysilicon film. As shown in FIG. 9, in Experimental Examples EE1 and EE2 that fall within the range of about 150 mJ/cm$^2$ to about 250 mJ/cm$^2$, respectively, it can be seen that there is almost no deviation in the electron mobility between the single irradiation region and the double irradiation region. On the contrary, in Comparative Experimental Examples CEE1 and CEE2, it can be seen that there is a relatively large deviation in the electron mobility between the single irradiation region and the double irradiation region.

The following Table 1 shows variations in root-mean-square (RMS) surface roughness in response to changes in the energy density of a laser beam irradiated to form a polysilicon film.

TABLE 1

|  | EE1 | | CEE1 | | CEE1 | |
| --- | --- | --- | --- | --- | --- | --- |
| Energy density (mJ/cm$^2$) | 250 | | 300 | | 350 | |
| Polysilicon film | Single irradiation region | Double irradiation region | Single irradiation region | Double irradiation region | Single irradiation region | Double irradiation region |
| Root-mean-square surface roughness (nm) | 40 | 38 | 77 | 178 | 161 | 249 |

As shown in Table 1, in Experimental Example EE1 within the energy range of 250 mJ/cm$^2$, it can be seen that the difference in root-mean-square surface roughness between the single irradiation region and the double irradiation region is no more than about 10%. In Comparative Experimental Examples CEE1 and CEE2, having energy densities in the range of 300 mJ/cm$^2$ and 350 mJ/cm$^2$, respectively, it can be seen that the difference in root-mean-square surface roughness between the single irradiation region and the double irradiation region is relatively large.

A method of manufacturing an organic light emitting diode display according to a yet another embodiment of the present invention will be described with reference to FIG. 10. A method of forming a polysilicon film according to the present embodiment of the present invention is similar to those of the previous embodiments, except for the range of the energy density of an irradiated laser beam. However, the polysilicon film in the present embodiment of the present invention is used as a part of a capacitor 80, rather than as a part of a thin film transistor.

Figure 10:
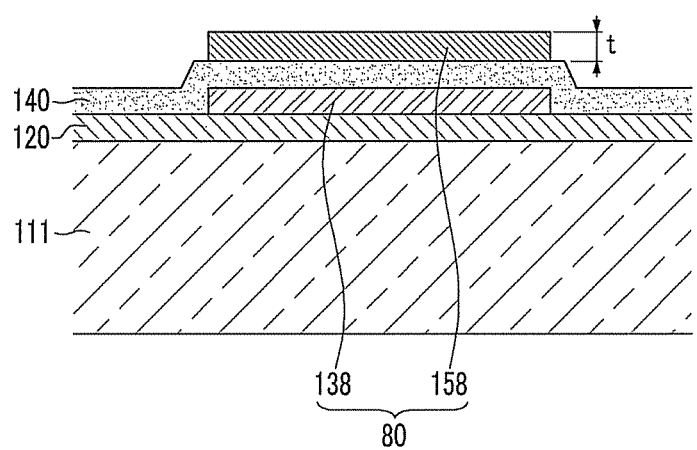
FIG. 10 is a cross-sectional view showing the structure of a capacitor manufactured by a method of manufacturing an organic light emitting diode according to yet another embodiment of the present invention.

FIG. 10 shows a capacitor 80 of an organic light emitting diode display manufactured according to the yet another embodiment of the present invention. As shown in FIG. 10, the organic light emitting diode display includes a substrate main body 111, a buffer layer 120 formed on the substrate main body 111, and a capacitor 80 formed on the buffer layer 120. The capacitor 80 comprises a first capacitor electrode 138 formed on the buffer layer 120, a gate insulating layer 140 formed on the first capacitor electrode 138, and a second capacitor electrode 158 formed on the gate insulating layer 140.

The first capacitor electrode 138 is made of a polysilicon film. The polysilicon film is formed by being irradiated with an excimer laser beam having energy density in the range of about 200 mJ/cm$^2$ to about 250 mJ/cm$^2$. The method of forming the polysilicon film is similar to the methods of formation described with respect to the previously described embodiments, except for the energy density of the laser beam.

The gate insulating layer 140 includes tetra ethyl ortho silicate (TEOS), silicon nitride (SiN$_x$), silicon oxide (SiO$_2$), either singularly or in combination.

For example, the gate insulating layer 140 is formed as a dual layer including a silicon nitride layer having a thickness of about 40 nm and a tetraethyl orthosilicate layer having a thickness of about 80 nm that are sequentially stacked therein. However, aspects of the present invention are not limited thereto, and the gate insulating layer 140 may have other suitable configurations.

The second capacitor electrode 158 includes molybdenum (Mo), chromium (Cr), tungsten (W), which are used singularly or in combination. However, aspects of the present invention are not limited thereto, and other suitable materials may be included in the second capacitor electrode. Moreover, in the present embodiment of the present invention, the second capacitor electrode 158 has a thickness (t) ranging from about 30 nm to about 80 nm.

A method of manufacturing the capacitor 80 using the polysilicon film according to the present embodiment of the present invention will be described below.

A first capacitor electrode 138 is formed by patterning the polysilicon film formed by excimer laser annealing (ELA). A gate insulating layer 140 is formed on the first capacitor electrode 138. The gate insulating layer 140 includes a silicon nitride layer having a thickness of about 40 nm, and a tetraethyl orthosilicate (TEOS) layer having a thickness of about 80 nm that are sequentially stacked therein. These inorganic films are formed by a plasma enhanced chemical vapor deposition (PECVD) method. However, aspects of the present invention are not limited thereto and the gate insulating layer may include other suitable layers or may be various suitable thicknesses and the inorganic films may be formed by other suitable methods.

A second capacitor electrode 158 is formed on the gate insulating layer 140. The second capacitor electrode 158 is formed so as to be overlapped with the first capacitor electrode 138. The second capacitor electrode 158 includes molybdenum (Mo), chromium (Cr), tungsten (W), used singularly or in combination. The second capacitor electrode 158 is formed at a thickness (t) ranging from about 30 nm to about 80 nm. However, aspects of the present invention are not limited thereto and the second capacitor electrode 158 may include other suitable materials and be formed at other suitable thicknesses.

The first capacitor electrode 138 is doped with an impurity which penetrates through the second capacitor electrode 158 to be doped in the first capacitor electrode 138. If the second capacitor electrode 158 has a thickness (t) exceeding about 80 nm, the impurity is not properly doped in the first capacitor electrode 138. On the other hand, if the second capacitor electrode 158 has a thickness (t) of less than about 30 nm, the electric characteristics of the capacitor are degraded. For example, a sheet resistance of the second capacitor electrode 158 may be degraded.

As an example, the impurity penetrates through the second capacitor electrode 158 to be doped in the second capacitor electrode 158 at an energy higher than about 80 keV and with a dose of more than about 1.0e15 atoms/cm$^2$. The impurity is any one of a P-type impurity and an N-type impurity.

Once the first capacitor electrode 138 is formed of a polysilicon film doped with an impurity, the capacitor 80 has a structure similar to that of a metal oxide semiconductor (MOS) capacitor and has characteristics similar to those of a metal insulator metal (MIM) capacitor that are relatively more suitable for an organic light emitting diode display. According to this manufacturing method, the crystalline grains of the polysilicon film 130 can be uniformly formed while using the excimer laser annealing (ELA). Particularly, it is possible to form a capacitor 80 with improved uniformity and form a capacitor 80 having characteristics that are more suitable for an organic light emitting diode display.

Experimental examples and comparative experimental examples according to the present embodiment of the present invention will be described with reference to FIGS. 11 and 12. In Experimental Examples EE1 to EE3, a polysilicon film was formed by a laser beam having energy densities of about 210 mJ/cm$^2$, about 230 mJ/cm$^2$, and about 250 mJ/cm$^2$, respectively. In Comparative Experimental Examples CEE1 and CEE2, a polysilicon film was formed by a laser beam having energy densities of about 190 mJ/cm$^2$ and about 270 mJ/cm$^2$, respectively. Moreover, the experimental examples and comparative experimental examples are crystallized only by a laser beam and without heat treatment.

Figure 11:
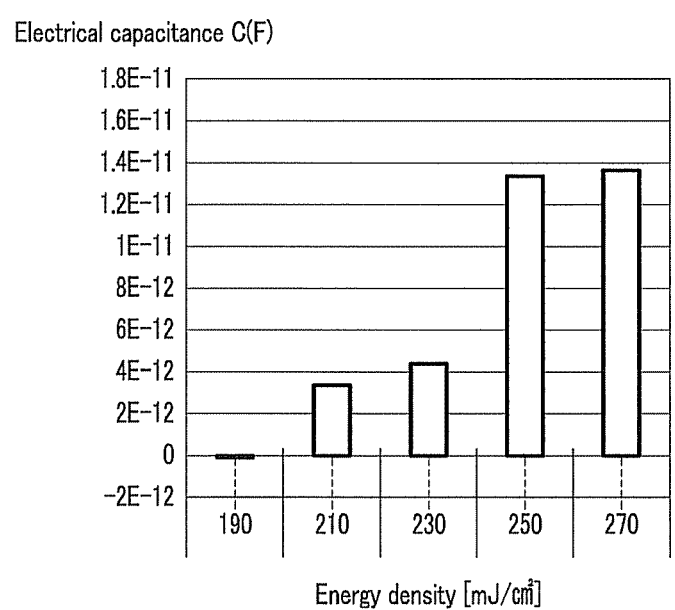
FIGS. 11 and 12 are graphs comparing experimental examples according to the embodiment of FIG. 10 with comparative experimental examples.

FIG. 11 shows variations in the electrical capacitance of the capacitor in response to changes in the energy density of the laser beam irradiated to form the polysilicon film. As shown FIG. 11, in Experimental Examples EE1 and EE2 which fall within the range of about 200 mJ/cm$^2$ to about 250 mJ/cm$^2$, respectively, it can be seen that a certain amount of electrical capacitance or more can be obtained. In other words, as shown in FIG. 11, in Experimental Examples EE1 and EE1, the electrical capacitance is greater than $2 \times 10^{-12}$ and less than $6 \times 10^{-12}$ F.

However, as in Comparative Experimental Example CEE1, it can be seen that sufficient electrical capacitance cannot be obtained in the case of crystallization by a laser beam having energy density of less than about 200 mJ/cm$^2$. In Comparative Experimental Example CEE2, although sufficient electrical capacitance can be obtained in the case of crystallization by a laser beam having energy density exceeding about 250 mJ/cm$^2$, the crystalline grains of the polysilicon film cannot be uniformly formed as can be seen from the experimental result of the foregoing second exemplary embodiment. That is, the device characteristics 80 become non-uniform.

Figure 12:
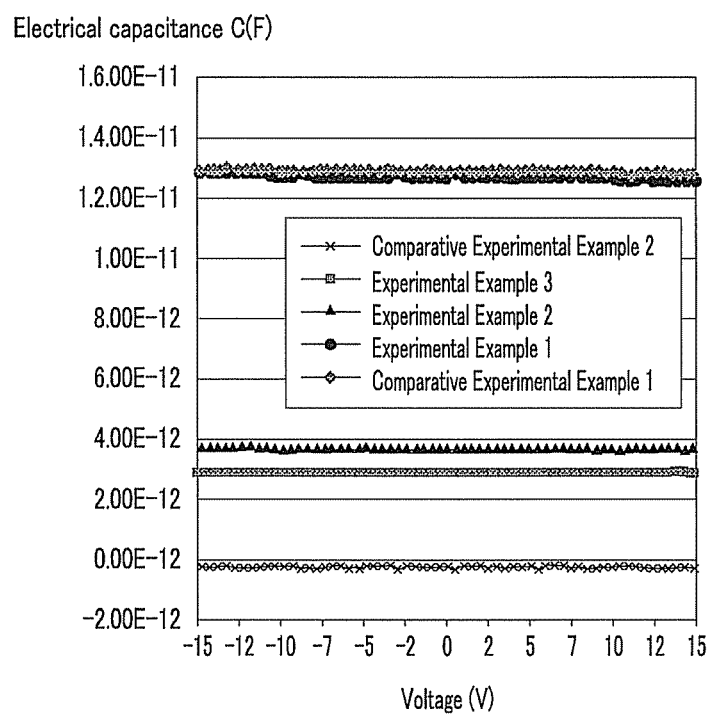

FIG. 12 shows variations of a capacitance-voltage (C-V) characteristic curve of the capacitor in response to changes in the energy density of the laser beam irradiated to form a polysilicon film. As shown in FIG. 2, the capacitor 80 formed according to the present embodiment of the present invention has a similar structure to that of a metal oxide semiconductor (MOS) capacitor, and has similar characteristics to those of a metal insulator metal (MIM) capacitor.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting diode, comprising:
    forming an amorphous silicon film on a buffer layer disposed on a substrate;
    heat-treating the amorphous silicon film to form a microcrystalline silicon film; and
    scanning and irradiating a linear laser beam twice or more onto the microcrystalline silicon film to form a polysilicon film,
    wherein a subsequent scanning of the linear laser beam partially overlaps previous scanning of the linear laser beam in a width direction,
    wherein the heat-treating is performed at a temperature ranging from about 580° C. to about 750° C. for about 10 to 180 minutes, and
    wherein forming the polysilicon layer comprises forming a first region and a second region such that a difference in root-mean-square (RMS) surface roughness between the first region and the second region is no more than about 10%.

2. The method of claim 1, wherein the microcrystalline silicon film is formed by a solid phase crystallization method.

3. The method of claim 1, wherein
    the laser beam comprises an excimer laser beam, and
    the polysilicon film is formed by excimer laser annealing.

4. The method of claim 3, wherein the laser beam has an energy density in a range of about 150 mJ/cm$^2$ to about 240 mJ/cm$^2$.

5. The method of claim 4, wherein scanning and irradiating the linear laser beam twice or more onto the microcrystalline silicon film to form the polysilicon film comprises forming the first region using irradiation of the laser beam twice in the polysilicon film and forming the second region using irradiation of the laser beam once in the polysilicon film.

6. The method of claim 1, wherein the laser beam has an energy density in a range of about 150 mJ/cm$^2$ to about 240 mJ/cm$^2$.

7. The method of claim 6, wherein the polysilicon film has an electron mobility in a range of about 2 cm$^2$/Vs to about 60 cm$^2$/Vs.

8. A method of manufacturing an organic light emitting diode, comprising:
    forming an amorphous silicon film on a buffer layer disposed on a substrate; and
    scanning and irradiating a linear laser beam twice or more onto the amorphous silicon film to form a polysilicon film,
    wherein a subsequent scanning of the linear laser beam partially overlaps previous scanning of the linear laser beam in a width direction,
    wherein the polysilicon film comprises at least one double irradiation region and at least two single irradiation regions, and
    wherein forming the polysilicon layer comprises forming the double irradiation region and the single irradiation region such that a difference in root-mean-square (RMS) surface roughness between the double irradiation region and the single irradiation region is no more than about 10%.

9. The method of claim 8, wherein
    the laser beam comprises an excimer laser beam, and
    the polysilicon film is formed by excimer laser annealing.

10. The method of claim 9, wherein scanning and irradiating the linear laser beam twice or more onto the microcrystalline silicon film to form the polysilicon film comprises forming the double irradiation region using irradiation of the laser beam twice in the polysilicon film and forming the single irradiation region using irradiation of the laser beam once in the polysilicon film.

11. The method of claim 9, wherein the laser beam has an energy density in a range of about 150 mJ/cm$^2$ to about 250 mJ/cm$^2$.

12. The method of claim 1, further comprising:
    patterning the polysilicon film to form a semiconductor layer;
    forming a gate insulating layer on the semiconductor layer;
    forming a gate electrode on the gate insulating layer so as to be overlapped with a part of the semiconductor layer;
    doping the semiconductor layer with an impurity, and dividing the semiconductor layer into a channel region overlapped with the gate electrode and source and drain regions formed on respective sides of the channel region;
    forming an interlayer insulating layer on the gate electrode; and
    forming a thin film transistor by forming a source electrode connected to the source region and a drain electrode connected to the drain region.

13. The method of claim 12, wherein the impurity is doped in the source and drain regions of the semiconductor layer with a dose of more than about 1.0e15 atoms/cm$^2$.

14. The method of claim 1, further comprising:
    patterning the polysilicon film to form a first capacitor electrode;
    forming a gate insulating layer on the first capacitor electrode;
    forming a second capacitor electrode on the gate insulating layer so as to be overlapped with the first capacitor electrode; and
    doping the first capacitor electrode with an impurity to form a capacitor.

15. The method of claim 14, wherein the laser beam has an energy density in a range of about 200 mJ/cm$^2$ to about 250 mJ/cm$^2$.

16. The method of claim 15, wherein the impurity is doped in the first capacitor electrode with a dose of more than about 1.0e15 atoms/cm$^2$.

17. The method of claim 8, further comprising:
    patterning the polysilicon film to form a semiconductor layer;
    forming a gate insulating layer on the semiconductor layer;
    forming a gate electrode on the gate insulating layer so as to be overlapped with a part of the semiconductor layer;

doping the semiconductor layer with an impurity, and dividing the semiconductor layer into a channel region overlapped with the gate electrode and source/drain regions formed on both sides of the channel region;

forming an interlayer insulating layer on the gate electrode; and forming a thin film transistor by forming a source electrode connected to the source region and a drain electrode connected to the drain region.

18. The method of claim 8, wherein forming the polysilicon film comprises forming uniform crystalline grains in the at least one double irradiation region and the at least two single irradiation regions of the polysilicon film.

* * * * *